United States Patent
Schmidt

(10) Patent No.: US 7,187,058 B2
(45) Date of Patent: Mar. 6, 2007

(54) SEMICONDUCTOR COMPONENT HAVING A PN JUNCTION AND A PASSIVATION LAYER APPLIED ON A SURFACE

(75) Inventor: Gerhard Schmidt, Wernberg-Wudmath (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/014,193

(22) Filed: Dec. 16, 2004

(65) Prior Publication Data
US 2005/0156284 A1 Jul. 21, 2005

(30) Foreign Application Priority Data
Dec. 16, 2003 (DE) .............................. 103 58 985.6

(51) Int. Cl.
*H01L 29/06* (2006.01)

(52) U.S. Cl. ...................... 257/626; 257/653; 257/646; 257/631; 257/636; 257/629

(58) Field of Classification Search ................ 257/603, 257/604, 605, 599, 601, 602, 329, 320, 344, 257/402, 408, 626, 653
See application file for complete search history.

(56) References Cited

U.S. PATENT DOCUMENTS 3,585,464 A * 6/1971 Castrucci et al. ........... 257/544
4,322,452 A 3/1982 Krausse et al.
4,954,868 A 9/1990 Bergmann et al.
(Continued)

FOREIGN PATENT DOCUMENTS

DE 27 30 367 A1 1/1979
EP 0 077 481 A2 4/1983

(Continued)

OTHER PUBLICATIONS

Gerlach, "Thyristoren", Halbleiter-Elektronik, vol. 12, Springer Verlag, 1979, pp. 151-159, (9 pages).

(Continued)

*Primary Examiner*—Nathan Flynn
*Assistant Examiner*—Fazli Erdem
(74) *Attorney, Agent, or Firm*—Maginot, Moore & Beck

(57) ABSTRACT

The invention relates to a semiconductor component having a semiconductor body (100) and at least one pn junction present in the semiconductor body (100) and an amorphous passivation layer (70) arranged at least in sections on a surface (101) of the semiconductor body (100), the following holding true for the minimum Ds,min of an interface state density Ds at the junction between the passivation layer (70) and the semiconductor body (100):

$$D_{s,min} \geq \frac{N_{S,Bd}}{E_g}$$

where $N_{S,Bd}$ is the breakdown charge and $E_g$ is the band gap of the semiconductor material used for the semiconductor body (100).

13 Claims, 10 Drawing Sheets

U.S. PATENT DOCUMENTS

| | | |
|---|---|---|
| 5,039,358 A | 8/1991 | Birkle et al. |
| 5,311,052 A | 5/1994 | Stengl et al. |
| 5,631,496 A | 5/1997 | Hammerschmidt et al. |

FOREIGN PATENT DOCUMENTS

| | | |
|---|---|---|
| EP | 0 168 771 A1 | 1/1986 |
| EP | 0 341 453 A1 | 11/1989 |
| EP | 0 381 111 A2 | 8/1990 |
| EP | 0 400 178 A1 | 12/1990 |
| EP | 0 624 901 A1 | 11/1994 |

OTHER PUBLICATIONS

Appels et al., "Thin Layer High-Voltage Devices", Philips Journal of Research, vol. 35, No. 1, 1980, pp. 1-13, (13 pages).

Temple, Victor, "Increased Avalanche Breakdown Voltage and Controlled Surface Electric Fields Using a Junction Termination Extension (JTE) Technique", IEEE Transactions on Electronic Devices, vol. ED-30, No. 8, Aug. 1983, pp. 954-957, (4 pages).

* cited by examiner

— 1/C^2 (100 kHz)
------ Fit with Ns=5E11cm^-2
— Ideal profile

SEMICONDUCTOR COMPONENT HAVING A PN JUNCTION AND A PASSIVATION LAYER APPLIED ON A SURFACE

BACKGROUND

The present invention relates to a semiconductor component having a pn junction present in a semiconductor layer and a passivation layer applied to a surface of the semiconductor layer.

In order to achieve a sufficiently high blocking capability of power semiconductor components, for example made of Si or SiC, suitable measures for controlling the high electric field strengths have to be implemented particularly in those regions in which a pn junction comes to the surface. In these regions in which semiconductor junctions come to the surface—usually in the edge region of the component—in the absence of additional measures, in the event of the semiconductor junction being reverse-biased, an avalanche generation may commence still distinctly before the dielectric strength in the bulk, that is to say within the semiconductor body, is reached. In this case, the lower dielectric strength in the edge region reduces the dielectric strength of the entire component. The required dielectric strength of customary power components, for example of IGBTs, lies between 600 V and 6.5 kV, by way of example.

The problem of the prematurely commencing edge breakdown may additionally be aggravated by the action of surface charges in a passivation layer that is usually applied to the edge region for the purpose of increasing the breakdown strength.

In order to increase the dielectric strength in the edge region, or in order to avoid an excessively great reduction of the dielectric strength at the edge in comparison with the bulk, a wide variety of concepts are known which aim to reduce the electric field that forms at a blocking pn junction at the surface and to keep the potential conditions stable over the long term.

In this case, it is possible, in principle, to distinguish conceptionally between the so-called mesa edge termination and the planar edge termination. In the case of the first concept, the semiconductor edge is contoured in the form of ground bevels or trenches through the blocking pn junctions, as is described for example in Baliga: "Power Semiconductor Devices", PWS Publishing, 1995, page 116. In the case of the second concept, suitable mask techniques are used to set either the lateral course of the diffusion profile and/or the reduction of the field strength in external space by means of insulating or semi-insulating layers, if appropriate in combination with field plates.

An overview of various embodiments of mesa edge terminations may be found for example in Gerlach: "Thyristoren" ["Thyristors"], Halbleiter-Elektronik, [Semiconductor Electronics], vol. 12, Springer-Verlag, 1979, page 151 et seq.

The planar edge termination is widespread in IC technology or in modern semiconductor switches, such as IGBTs or power MOSFETs, and also the associated freewheeling diodes. Some of the most important embodiments of such planar edge terminations are described briefly below.

Components with planar edge terminations contain a pn junction in the component which comes to the surface at a distance from an edge of the component. In order to produce such a pn junction, by way of example, a contiguous, highly doped region is introduced into a more weakly doped semiconductor layer, as is described as a result for example in Baliga, loc. cit., page 82. Due to the well-type course of the semiconductor junction, the electric field lines are crowded together to a greater extent in the region of greatest curvature and the avalanche generation commences prematurely here. In this case, this effect is all the more pronounced, the higher the curvature and the lower the basic doping of the semiconductor layer, or the shallower the introduced well.

In order to counteract that, by way of example, additional, floating field limiting rings are incorporated, which act as voltage dividers and therefore reduce the curvature of the potential lines in the edge region, this being described in Baliga, loc. cit., pages 98–100. Said field rings are doped complementarily with respect to the basic doping.

A further known possibility for attenuating field spikes that occur at the pn junction consists in smoothing the potential distribution by means of an equipotential area above the pn junction in the form of an electrically conductive, in particular metallic, field plate. The metal electrode is kept at an appropriate distance from the semiconductor surface by means of an insulating intermediate layer, generally a semiconductor oxide. Such a field plate structure, which can also be combined with a field ring structure, is described for example in Baliga, loc. cit., pages 100–102, or in EP 0 341 453 A1.

A further known edge termination functioning according to the so-called RESURF principle (RESURF=Reduced Surface Field) is illustrated in FIG. 1. Such an edge termination is described for example in J. A. Appels et al., Philips Research Report 35 (1980), pages 1–13.

FIG. 1 shows a semiconductor body 100 having a semiconductor layer 12, which has an n-type basic doping in the example. In the region of a side 101 of the semiconductor body, a highly doped well 20, of a complementary power type with respect to the semiconductor layer 12, is introduced into said semiconductor layer 100 for the purpose of forming a pn junction, said well being p-doped in the example and ending at a distance from an edge 102 of the semiconductor body 100. A field expansion at the surface 101 of the semiconductor body 100 is achieved by means of a more weakly doped p-type region 30, which is also designated as π region. It extends in the so-called edge region of the semiconductor body 100 between the more highly doped well 20, which forms the anode in a diode, and a channel stopper 40 that is arranged at the edge 102 and is of the same power type as the basic doping but doped more highly. The π region 30 may be formed such that it is shallower or deeper than the anode 20 in the vertical direction of the semiconductor body, it being possible for said anode also to be completely embedded in the π zone 30 in a manner that is not specifically illustrated.

This concept and edge concepts additionally explained below can be applied to any desired semiconductor components having a pn junction, the component in FIG. 1 being illustrated as a diode for the sake of simplicity, the anode zone of which diode is formed by the p-doped well 20. The cathode zone is formed by a more heavily doped semiconductor zone 14 adjoining the semiconductor layer 12 in the region of a rear side 103 of the semiconductor body 100. The reference symbols 52 and 54 designate terminal electrodes.

The JTE structure (JTE=Junction Termination Extension) that is illustrated in FIG. 2 and is described for example in Temple, V. A. K., IEEE Electronic Devices 39, (1983), pages 954–957, constitutes a modification of the RESURF structure. In the case of the JTE structure, a more weakly p-doped π zone 32 is pulled back from the channel stopper 40 in the direction of the anode 20, it being possible for the π zone to be connected annularly to the p-doped well, as is illustrated by a broken line, or else to contain this completely, as is illustrated by the solid line. The mode of operation of the JTE structure corresponds to that of the RESURF structure.

FIG. 3 shows a further known edge termination having a so-called VLD structure (VLD=Variation of Lateral Doping). Such an edge termination structure, which is described for example in EP 0168771 A1, has a π zone 34 that is doped more weakly than the well 20 and whose doping decreases in the lateral direction of the semiconductor body 100 in the direction of the edge 102. In this case, the doping of the π zone 34 may merge continuously or discontinuously with the doping of the heavily doped well 20.

In order to limit the space charge zone at the outermost semiconductor edge in the case of a reverse-biased pn junction, a channel stopper (reference symbol 40 in the figures) may be provided in the case of all the edge terminations explained.

Furthermore, variants and combinations of the edge terminations explained are already being used. Thus, by way of example, the JTE structure with an additional field plate construction proves to be expedient. The choice of the respective edge termination also depends not least on what thermal budget can be made available for the indiffusion of dopant atoms into the semiconductor layer.

Apart from the field plate structure, which already shields the semiconductor junction well from external space by means of the at least one metal electrode, the requirement for a reliable surface passivation of the semiconductor layer is also increasingly being manifested in the case of the other edge terminations explained. This is because surface charges at the surface of the semiconductor body likewise influence the potential distribution.

Such a passivation layer at the surface 101 of the semiconductor body above the pn junction is designated by the reference symbol 60 in FIGS. 1 to 3.

It has been the view previously that the passivation layer ought to be free of stationary charges and also of mobile charges that may drift in the electric field of the reverse-biased semiconductor junction and thus form the cause of blocking instabilities.

Moreover, passivation layers must be sufficiently electrically robust to withstand the peak field strengths at the surface, which, depending on the structure, may far exceed the value of the bulk breakdown field strength, which is approximately 200 kV/cm in the case of silicon. Dielectrics such as thermal oxides, $Si_3N_4$ layers, silicones or organic materials such as polyimide, for example, are generally used as such passivation layers.

In addition to such dielectrics, semi-insulating layers such as, for example, amorphous silicon or amorphous carbon are also used as passivation layers for semiconductor components, which are able, on account of their finite specific conductivity, to influence the potential conditions in the semiconductor body with the pn junction. A semiconductor component having such a semi-insulating layer as passivation layer is described in EP 0 077 481 A2, for example. The component described therein comprises an amorphous Si layer on an oxide, which layer serves as a resistive voltage divider between an anodal field plate and a field plate on the channel stopper side. Further components having semi-insulating layers as passivation layers are described in DE-A-27 30 367 or EP 0 400 178 A1, for example.

EP 0 400 178 A1 in this case describes setting, by way of the deposition conditions of the amorphous passivation layer, the electrical conductivity of said layer and the barrier height at the interface between passivation layer and crystalline semiconductor in such a way that an influencing of the potential conditions at the surface of the blocking component is avoided in the case of the layers described therein comprising amorphous silicon, amorphous hydrogen-containing carbon (aC:H) or amorphous silicon carbide (SiC). This means that: the passivation layer, in the event of the interaction with the electric field of the reverse-biased pn junction at the amorphous-crystalline interface, is permitted to lead only to a band bending with a magnitude such that an inversion or avalanche generation does not occur. This ensures that the semi-insulating passivation layer behaves neutrally and the potential conditions are determined exclusively by the predetermined edge structure. In this case, on account of the good electrical coupling to the substrate, the amorphous layer assumes the potential profile of the reverse-biased component.

On account of the shielding effect of such an amorphous passivation layer, which can be described in a manner analogous to that in the case of a metallic field plate, by its high electronic state density in the mobility gap, a good stability of the component passivated in this way is achieved.

EP 0 624 901 A1 describes a semiconductor component having a passivation layer comprising an amorphous hydrogen-containing carbon, said layer having a boron doping of between 0.1% and 4% in order to avoid an inversion layer.

Such amorphous passivation layers are obtained in a PECVD process (PECVD=Plasma Enhanced Chemical Vapor Deposition), which, by way of the deposition conditions, permits the physical properties of the passivation layers, in particular the resistivity thereof and the junction resistance thereof with respect to the semiconductor body, to be set within wide limits. The production method and the application of such passivation layers for semiconductor components are described in detail in EP 0 381 111 A2, for example.

The edge termination concepts explained have their area of use depending on technology, but are subject more or less to the following disadvantages that drastically increase as the blocking capability of the components increases:

1. The production outlay for the edge termination increases with higher reverse voltage and constrains a high process complexity.
2. The optimization of the field profile is not possible simultaneously for the static and dynamic blocking case. This leads to impairment of the turn-off robustness particularly in the case of rapidly switching power components. If the semiconductor layer with the semiconductor junction is depleted during the transition from the conducting to the blocking state, then a reverse current flows that has a considerable influence on the potential conditions in the edge region during the rise in the reverse voltage.
3. As the required dielectric strength of the components increases, the induction effect of surface charges becomes ever greater when the semiconductor has a low basic doping. The susceptibility to blocking instabilities increases. The demand for a long-term reliability makes ever more stringent requirements of the passivation layers.
4. As the required dielectric strength increases, more and more space has to be made available for the edge termination in order to control the surface field strength. In high-voltage components, the width of said edge may finally amount to more than triple the thickness of the base (reference symbol 12 in FIGS. 1 to 3) and, in the case of small chips, leads to a considerable loss of active area.

SUMMARY

It is an aim of the present invention to provide a semiconductor component having a semiconductor layer and at least one pn junction present in the semiconductor layer and an amorphous passivation layer arranged at least in sections on a surface of the semiconductor layer, which semiconductor component has improved blocking properties in the static and in the dynamic blocking case.

This aim is achieved by embodiments of the invention.

The semiconductor component according to the invention comprises a semiconductor body having at least one pn junction present in the semiconductor body and an amorphous passivation layer arranged in sections on a surface of the semiconductor body. In this case, the following holds true for the minimum Ds,min of an interface state density Ds at the interface between passivation layer and semiconductor body:

$$Ds,min \geq N_{S,Bd}/E_g, \quad (1)$$

where $N_{S,Bd}$ is the breakdown charge and $E_g$ is the band gap of the semiconductor material used for the semiconductor body 100.

By virtue of the interface states at the amorphous-crystalline junction between the passivation layer and the semiconductor body, such a passivation layer has an active effect on the field strength distribution at the surface of the component and favorably influences this both in the static and the dynamic blocking case.

If the minimum Ds,min of the state density Ds satisfies the relationship according to the invention, then this results in a non-negligible electronic reaction of the passivation layer on the semiconductor body, which can be characterized by a reaction factor r. Said reaction factor is dependent on the minimum of the state density distribution, the thickness of the passivation layer, a sheet resistance Rs of the passivation layer, an interface resistance Rs of the interface between the passivation layer and the semiconductor body, and also the elementary charge q. In this case, the deposition conditions of the passivation layer are chosen in such a way that, for said reaction factor $$r = q \cdot \frac{Rs, \max}{Rb} \cdot Ds, \min \cdot d^2 \quad (2)$$

the following holds true:

$$r \geq 10^5 \text{ kV}^{-1}.$$

Such a passivation layer that satisfies the condition according to the invention with regard to the interface state density may be used and set accordingly, depending on the structure of the component, both for so-called planar edge terminations and for so-called mesa edge terminations. In the case of planar edge terminations, the passivation layer is applied to a front or rear side of the semiconductor body which has the pn junction, while in the case of so-called mesa edge terminations it may be applied to an outer edge of the semiconductor body or to an edge formed by a trench in the semiconductor body.

The passivation layer preferably comprises an amorphous hydrogen-containing carbon (aC:H), amorphous silicon or amorphous silicon carbide.

The passivation with aC:H layers is particularly advantageous in this case since these layers have diamondlike properties under suitable deposition conditions. They are distinguished by a high thermal conductivity, a high mechanical hardness, a low water permeation coefficient and also by resistance to concentrated acids and alkaline solutions, as a result of which they also afford a surface refinement. On account of the aforementioned similarity to diamond, aC:H layers are also referred to as DLC layers (DLC=Diamond Like Carbon).

The present invention departs from the path of using semi-insulating passivation layers, in particular aC:H layers, merely as neutrally acting shielding layers, as a result of which the above-explained disadvantages of known edge structures can be eliminated.

The present invention is explained in more detail below using exemplary embodiments with reference to figures.

DETAILED DESCRIPTION

Figure 1:
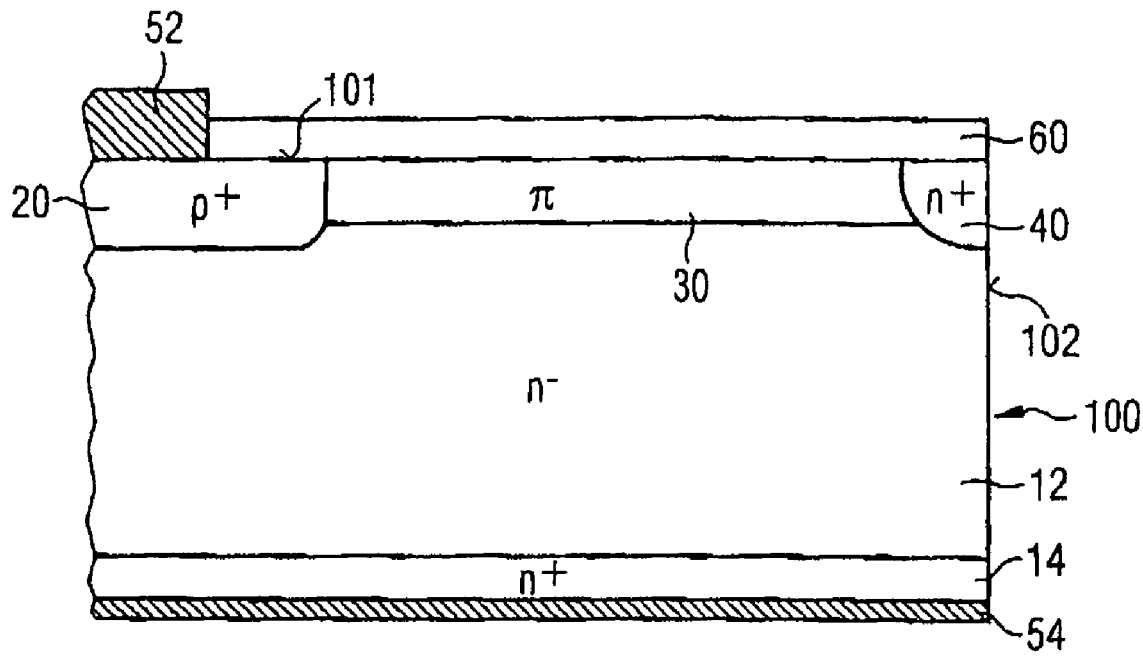
FIG. 1 shows a semiconductor component with an edge termination having a RESURF structure according to the prior art.
Figure 2:
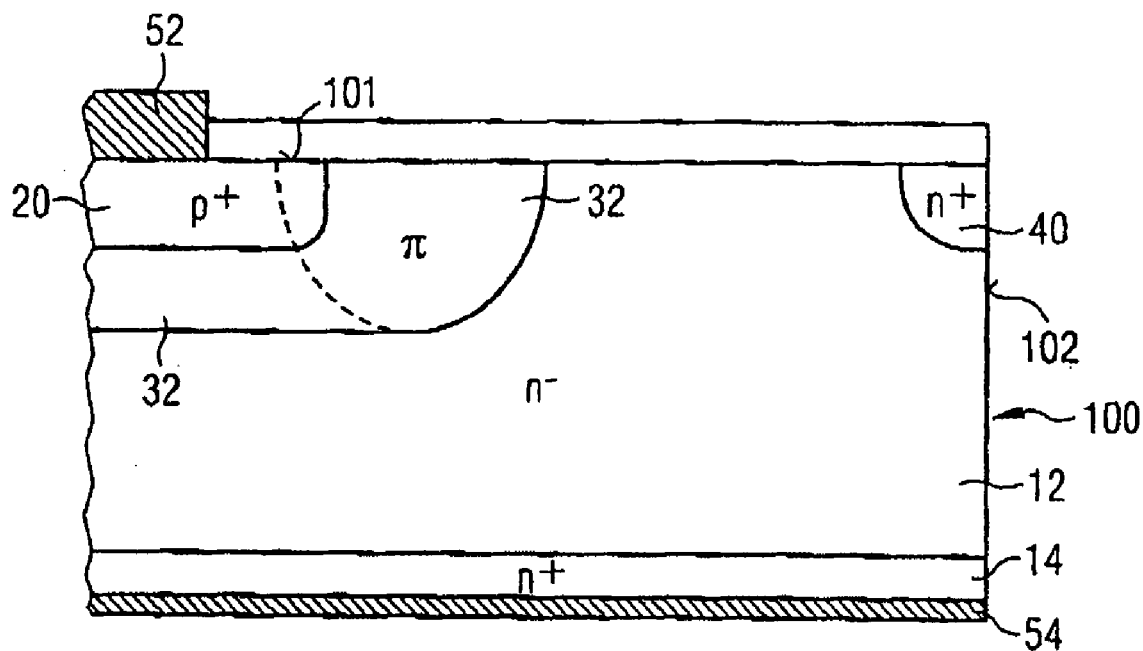
FIG. 2 shows a semiconductor component with an edge termination having a JTE structure according to the prior art.
Figure 3:
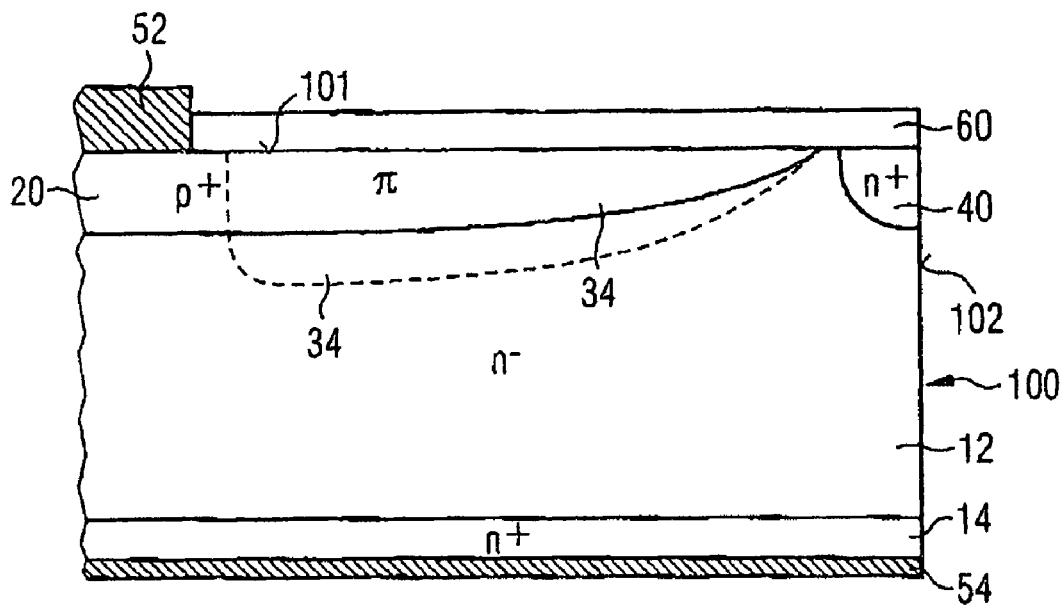
FIG. 3 shows a semiconductor component with an edge termination having a VLD structure according to the prior art.
Figure 4:
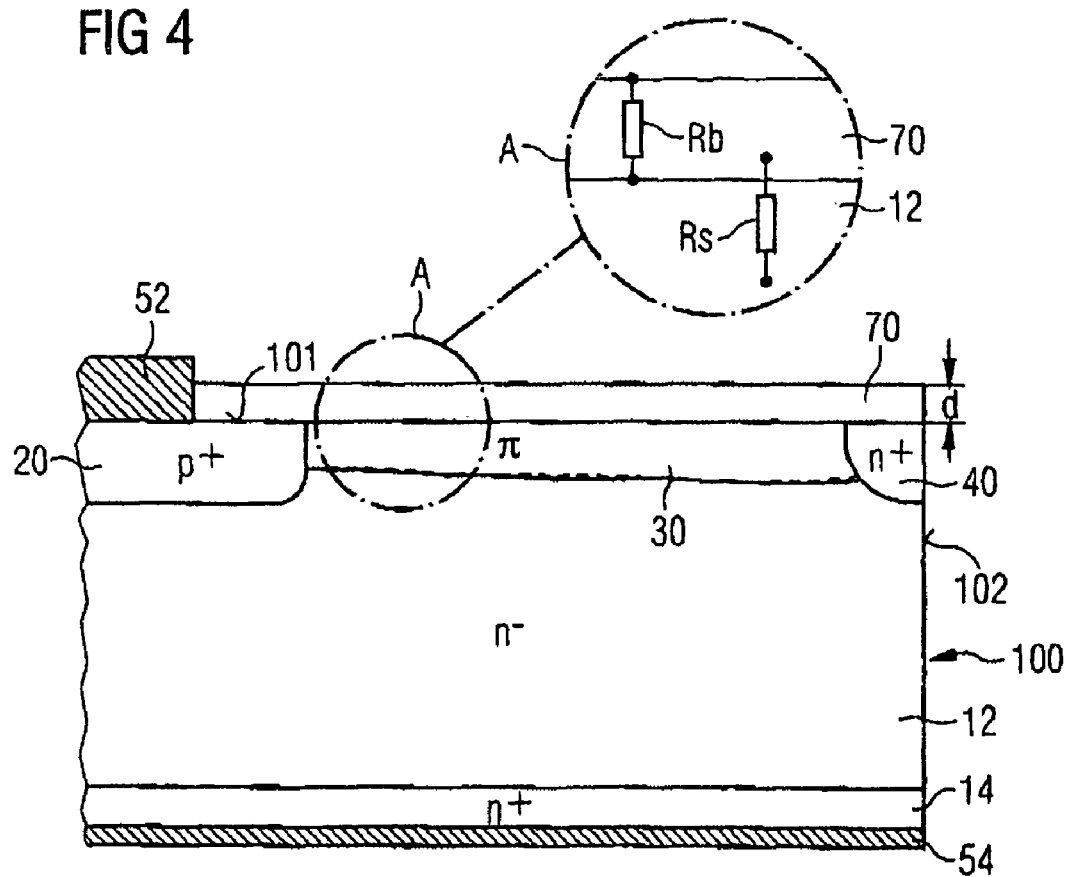
FIG. 4 shows a semiconductor component according to the invention with a pn junction and an amorphous passivation layer applied to a surface.

FIG. 4 shows a detail from a semiconductor component according to the invention, which is formed as a diode in the example. The component comprises a semiconductor body 100 having a semiconductor layer 12, which is weakly n-doped in the example and into which a well 20 doped complementarily with respect to the semiconductor layer 12 is introduced proceeding from a front side 101 of the semiconductor body 100. This p-doped well 20 and the semiconductor layer 12 form a pn junction that comes to the surface of the semiconductor body 100 at a distance from an edge 102 of the semiconductor body 100 in the region of the front side 101.

An electroactive amorphous passivation layer 70, which comprises for example amorphous hydrogen-containing carbon (aC:H), amorphous silicon or amorphous silicon carbide, is applied to the front side 101 above said pn junction. This layer 70 is produced for example by means of a PECVD method, which will be explained below. Referring to the detail illustration A in FIG. 4, said amorphous passivation layer 70 has a sheet resistance Rb, which is proportional to a layer thickness d of said passivation layer 70 and can furthermore be set by way of the deposition conditions of said passivation layer. Moreover, a junction resistance Rs is present between the crystalline semiconductor body 100 and the amorphous passivation layer 70, and can likewise be set by way of the deposition conditions of said passivation layer 70.

The electroactive passivation layer is obtained by setting the deposition conditions during the production of said passivation layer 70 in such a way that $Ds, min \geq N_{S,Bd}/E_g$ holds true for an interface state density of the interface between the passivation layer 70 and the semiconductor layer 12 of the semiconductor body, where Ds,min is the minimum of the interface state density (yet to be explained), $N_{S,Bd}$ is the breakdown charge of the semiconductor material used for the semiconductor body 100, and $E_g$ is the band gap of said semiconductor material.

The component illustrated comprises a more heavily n-doped semiconductor layer 14 in the region of a rear side 14, which layer forms the cathode zones of the component.

The anode zone 20 and the cathode zone 14 are respectively conductive-connected by terminal electrodes 52, 54.

The pn junction between the anode zone 20 and the semiconductor layer 12 forming the base zone of the component is forward-biased when a positive voltage is applied between the anode electrode 52 and the cathode electrode 54. The pn junction effects blocking when a negative voltage is applied between the anode electrode 52 and the cathode electrode 54, the electroactive passivation layer 70, in the case of a blocking pn junction, influencing the field strength distribution in the edge region of the component to the effect that the dielectric strength of the component is significantly increased in comparison with a component without such a passivation layer.

A weakly doped semiconductor zone 30 of the same conduction type as the well 20 is advantageously present, which runs in the lateral direction below the front side 101 between the well 20 and the edge 106 or a channel stopper 40 arranged at the edge, the channel stopper being of the same conduction type as the semiconductor layer 12 but more heavily doped.

It should be pointed out that the passivation layer 70 illustrated in FIG. 4 can be applied, of course, to any desired semiconductor components having a pn junction. MOSFETs or IGBTs shall be mentioned as an example here, in the case of which, in a sufficiently known manner, a junction corresponding to the pn junction between the semiconductor zone 20 and the semiconductor layer 12 is present between the body zone and the drift zone of the component.

Figure 5:
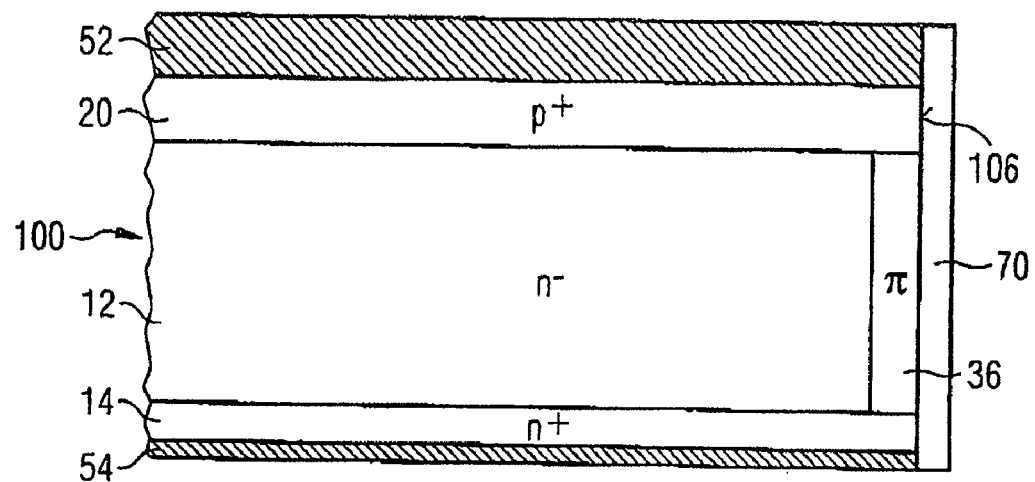
FIG. 5 shows an exemplary embodiment of a semiconductor component according to the invention with an amorphous passivation layer applied to an edge.

FIG. 5 shows a further embodiment of a semiconductor component according to the invention, which differs from that illustrated in FIG. 4 essentially by virtue of the fact that the heavily doped semiconductor zone 20 reaches in the lateral direction of the semiconductor body 100 as far as the edge 106 of the semiconductor body 100. In this case, the electroactive passivation layer 70 extends along the edge areas 106 of the semiconductor body from the front side 101 as far as the rear side 102, the terminal electrodes 52, 54 additionally being covered in the edge region in the example. In order to improve the blocking behavior further, a weakly p-doped semiconductor zone 36 is additionally present, which extends along the edge 106 between the heavily p-doped semiconductor zone 20 and the heavily n-doped semiconductor zone 14 arranged in the region of the rear side, said semiconductor zone 36 corresponding to the π zone explained in the introduction.

Figure 6:
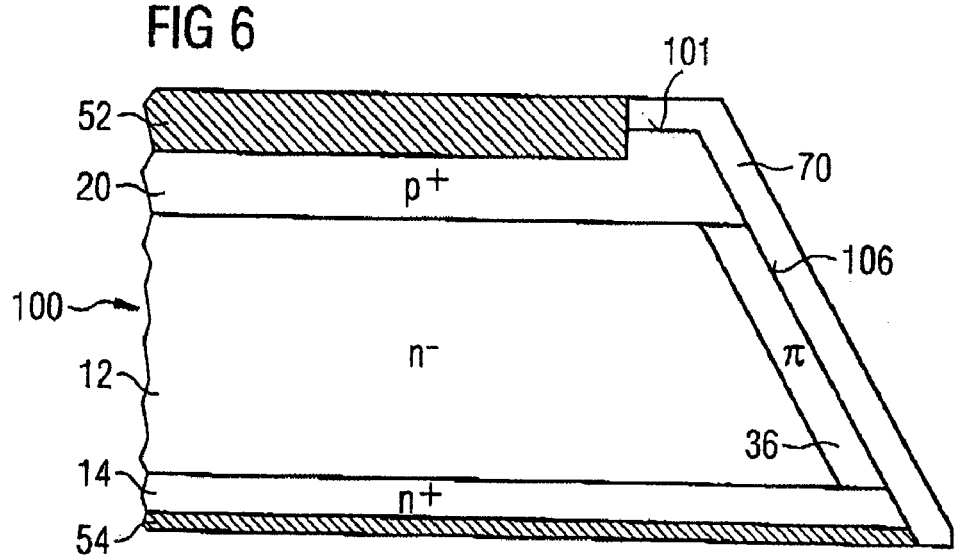
FIG. 6 shows an exemplary embodiment of a semiconductor component according to the invention with a beveled edge and an amorphous passivation layer applied to the edge.

FIG. 6 shows a modification of the semiconductor component illustrated in FIG. 5, this component in FIG. 6 differing from that illustrated in FIG. 5 by virtue of the fact that the edge 106 runs in beveled fashion, that is to say at an angle of less than 90° relative to the front side 101 of the semiconductor body 100. In this component, too, the heavily p-doped semiconductor zone 20 reaches as far as the edge 106. A passivation layer 70 having the properties already explained extends along the edge 106 and, in the exemplary embodiment, also over a region of the front side 101 that adjoins the edge 106.

Figure 7:
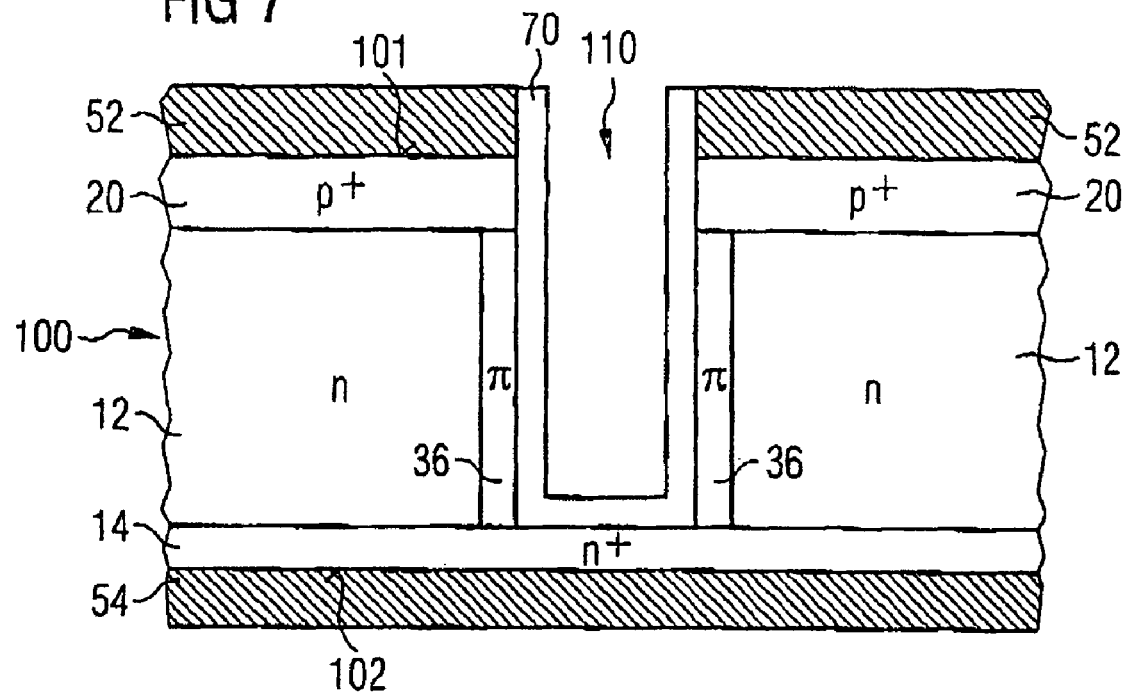
FIG. 7 shows an exemplary embodiment of a semiconductor component according to the invention with an amorphous passivation layer applied to sidewalls of a trench.

FIG. 7 shows a further exemplary embodiment of a semiconductor component according to the invention. In the case of this exemplary embodiment, a trench 110 extends into the semiconductor body 100 proceeding from the front side 101, on both sides of the trench pn junctions being formed between heavily p-doped semiconductor zones 20 and an n-doped semiconductor layer 12, which reach in the lateral direction of the semiconductor body 100 as far as the trench 110. For surface passivation, an electroactive passivation layer 70 having the properties already explained is applied to sidewalls, and preferably also to the bottom, of the trench 110. Preferably, in accordance with the concept already explained with reference to FIG. 5, a weakly p-doped semiconductor zone 36 extends between the heavily p-doped semiconductor zone 20 in the region of the front side 101 and the heavily n-doped semiconductor zone 14 in the region of the rear side 102 of the semiconductor body 100.

In the case of the component in accordance with FIG. 7, there is the possibility, in particular, of integrating separate semiconductor components on opposite sides of the trench 110, which have a common rear-side terminal and which, moreover, are electrically insulated from one another by the trench 110. In addition to the diode structures illustrated in FIG. 7, it is also possible, of course, in this case to integrate any desired semiconductor components having a pn junction, for example MOSFETs or IGBTs, on both sides of the trench 110.

The essential aspect of the invention consists in providing an electroactive amorphous passivation layer, designated by the reference symbol 70 in FIGS. 4 to 7, in the case of which the minimum Ds,min of the interface state density Ds is greater than or equal to the quotient of breakdown charge and band gap of the semiconductor material used for the semiconductor body. This condition holds true at least in sections relative to individual area sections of the passivation layer 70 and the interface between the passivation layer 70 and the semiconductor body 100.

The advantageous effect of such a passivation layer is explained below.

In EP 400 179 B1, which is mentioned in the introduction and describes a neutral passivation layer, it is required that the quotient of a blocking current density $j_0$ of the amorphous-crystalline junction and a specific conductivity $\sigma$ of the passivation layer, at every point of the passivation layer, must be greater than the product of the layer thickness d of the passivation layer and a tangential electric field gradient $\delta E_x/\delta x$ at the surface of the semiconductor body in order thereby to avoid an appreciable voltage drop at the amorphous-crystalline boundary layer.

In this case, the blocking current densities result from the barrier height of the amorphous-crystalline junction and are therefore generally different at an n-type and p-type substrate. In order to obtain a good electrical coupling to both types of substrate, it must be ensured in this case, either by way of the deposition parameters or by way of a doping of the layer, that the Fermi level lies approximately in the center of the mobility gap. This means that the barrier heights are of comparable magnitude and an inversion of the interface is avoided.

In the case of the semiconductor component according to the invention, in which the minimum Ds,min of the interface state density Ds is greater than or equal to the quotient of breakdown charge $N_{S,Bd}$ and band gap $E_g$, in contrast to this, a high density of surface states forms at the amorphous-crystalline interface between the passivation layer 70 and the semiconductor layer 100. In this case, the blocking current is supplied by surface generation and the Fermi level lies at the minimum of the surface state density distribution.

Any displacement of the Fermi level from this position, brought about by a current flow via the amorphous-crystalline interface, then leads to a reoccupation of the states in the vicinity of the Fermi level and thus to the establishment of a (location-dependent) surface charge density, which may bear a positive or negative sign depending on the loading direction, and which counteracts an electric field building up in the semiconductor body 100, which results in an increased dielectric strength.

If the state density in this case reaches values which are of the order of magnitude of $10^{13}$ cm$^{-2}$eV$^{-1}$ in the case of silicon, then very small voltage values of approximately 100 mV at the amorphous-crystalline interface already suffice to build up charge densities which can have a considerable influence on the potential distribution.

The charge density distribution follows the tangential field gradient in this case. This is because the current flow via the amorphous-crystalline interface between passivation layer 70 and semiconductor body 100 from the semiconductor body 100 or into the semiconductor body 100 is constrained by the change in the tangential electric field strength.

Figure 8:
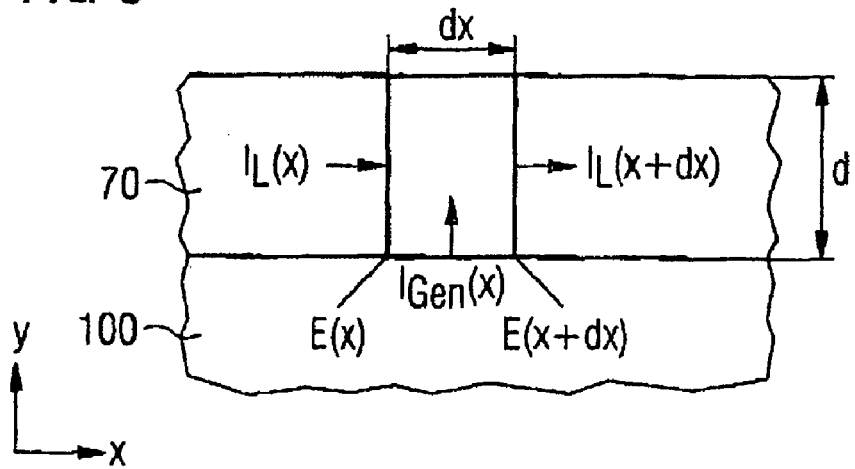
FIG. 8 shows a detail from a semiconductor body and a passivation layer applied thereto for elucidating electrical parameters of the passivation layer and the interface between the passivation layer and the semiconductor body.

In order to elucidate these facts, FIG. 8 shows a detail from the interface between the semiconductor body 100 and the passivation layer 70. Taking account of the system of coordinates illustrated, the x direction of which runs parallel to the interface and the y direction of which runs perpendicular to the interface, the following holds true on the basis of the continuity equation for the surface generation current density $j_{gen}$ of the generation current $J_{Gen}$:

$$j_{gen} = d \cdot \frac{\delta j_x}{\delta x} \quad (3)$$

and with ohm's law $j_x = \sigma \cdot E_x$, there results analogously to (3):

$$j_{gen} = d \cdot \sigma \cdot \frac{\delta E_x}{\delta x} \quad (4)$$

where $\sigma$ is the resistivity of the passivation layer 70, $E_x$ is the component of the electric field strength in the x direction and $j_x$ is the current density corresponding to the lateral current flow $I_L$ illustrated in FIG. 8.

In this case, the interface resistance Rs is defined depending on a voltage $U_s$ at the interface as:

$$Rs = \frac{Us}{j_{gen}} \quad (5)$$

where $j_{gen}$ denotes the current flowing through a predetermined area, for example 1 cm$^2$, of the amorphous-crystalline interface, with the result that the interface resistance Rs is related to this area section.

Insertion into (4) yields:

$$Us(x) = Rs \cdot d \cdot \sigma \cdot \frac{\delta E_x}{\delta x} \quad (6)$$

Assuming a known surface state density distribution Ds(E), it is possible, with E=-q·U, to define an interface capacitance Cs:

$$Cs(U) = q^2 \cdot Ds(qU) \quad (7)$$

where q denotes the magnitude of the elementary charge and E denotes the energy stored in the interface capacitance.

Like the interface resistance Rs, this interface capacitance Cs is related to a predetermined area, for example 1 cm².

In the case of a voltage drop Us(x) at the amorphous-crystalline interface in accordance with (6), the charge density Qs finally results taking account of (7) at a location x of the interface:

$$Qs(x) = \int_0^{Us} Cs(U)dU + Q_0 \qquad (8)$$

where $Q_0$ denotes a locally constant charge density that results from a basic occupation of surface states for Us=0 on account of the band bending.

It should be pointed out that the charge density is calculated exactly from the integral over the product of state density and occupation probability:

$$Qs(x) = q \cdot \int f(\in) \cdot D_{S,Acc} + [1-f(\in)] \cdot D_{S,Don} d\in \qquad (8a)$$

the acceptor terms being occupied with the Fermi distribution function $$f(\epsilon) = \frac{1}{1+\exp\left(-\frac{\epsilon-\epsilon_F}{kT}\right)} \qquad (8b)$$

and the donor terms with $1-f(\in)$, the probability for the absence of an electron. In this case, the Fermi distribution function assumes values between 0 and 1 only in a transition region of $\approx \in_F \pm 3$ kT around the Fermi level. Above or below, the occupation probability is constant at 0 or at 1.

If it is assumed, however, that the charge centroid lies at the minimum of the state density distribution and that to an approximation $D_{S,Acc}=D_{S,Don}$ holds true there for a transition region of approximately $\pm 3$ kT, where $D_{s,Acc}$ is the state density of the acceptors and $D_{S,Don}$ is the state density of the donors, equation (8a) turns into equation (8), which forms the basis for the consideration below.

Figure 9:
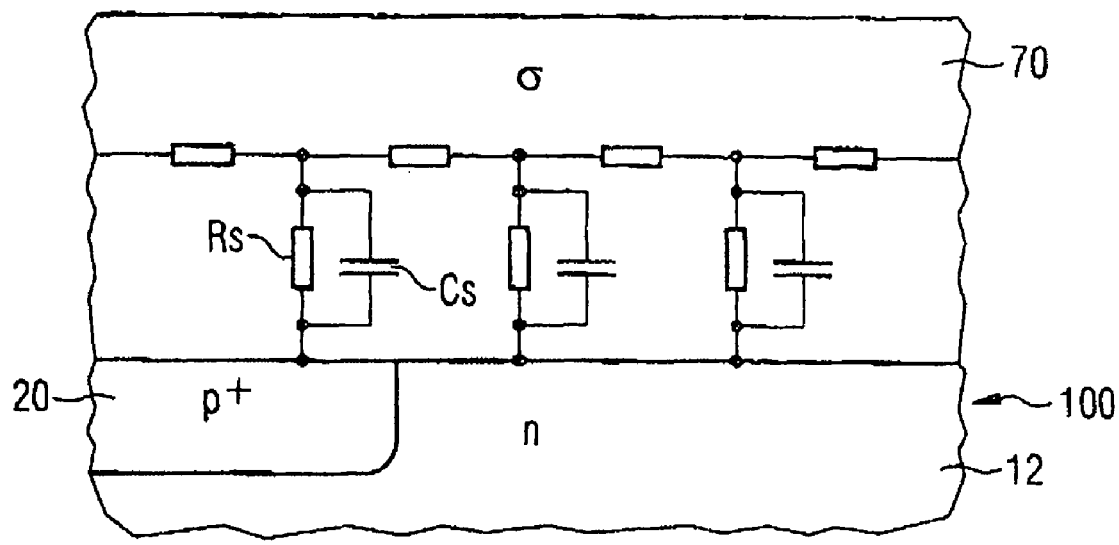
FIG. 9 illustrates the equivalent circuit diagram of the arrangement with the semiconductor body and the passivation layer applied thereto on the basis of a detail from the semiconductor component illustrated in FIG. 4.

FIG. 9 shows, on the basis of a detail from the component in FIG. 4, the equivalent circuit diagram for the structure with the semiconductor layer 100 and the electronically active passivation layer 70 applied thereto, with the interface resistances Rs and the interface capacitances Cs and also the resistivity σ of the passivation layer 70.

The passive system illustrated undergoes transient recovery when a reverse voltage is applied to the pn junction between the well 20 and the semiconductor layer 12 in such a way that the voltage drop caused by the field gradient according to equation (6) generates a charge density distribution in accordance with equation (8), which alters the potential conditions at the surface of the component until charge density distribution and field distribution balance one another.

Since the interface capacitances Cs ultimately result from the reoccupation of the surface states, charge reversal time constants of the order of magnitude of the dielectric relaxation time are to be expected.

The amorphous-crystalline junction between the semiconductor body 100 and the passivation layer 70 and also the semi-insulating passivation layer 70 itself can be characterized by means of current, voltage and admittance measurements, as explained below.

For measurement purposes, test structures were produced on boron- or phosphorus-doped 6" silicon wafers polished on one side and having different resistivities.

Figure 10:
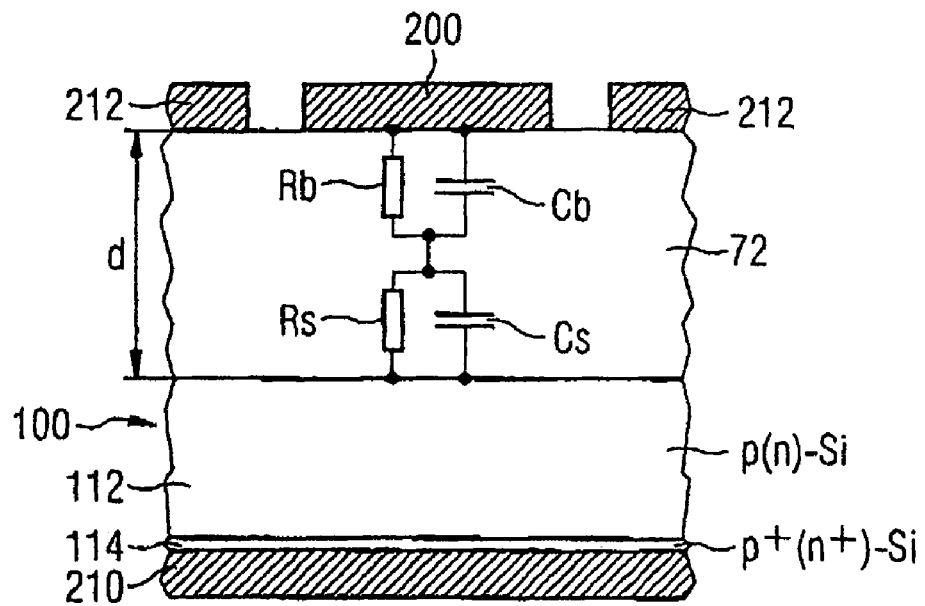
FIG. 10 shows a detail from a test structure for carrying out measurements for determining the properties of an amorphous passivation layer applied to a semiconductor substrate.

FIG. 10 shows a detail from such a test structure, the reference symbol 110 designating a p- or n-doped silicon wafer, 112 designating a region having the basic doping of the wafer, and 114 designating a rear-side region of the wafer that is highly doped in order to obtain a low-impedance terminal contact. The reference symbol 210 designates a metal electrode applied to the rear side of the wafer.

The electrical equivalent circuit diagram of the passivation layer 72 with the junction resistance Rs, the sheet resistance Rb, the sheet capacitance Cb and the interface capacitance Cs is additionally depicted in the test structure in accordance with FIG. 10.

The doping on the rear side of the wafer was intensified by implantation and a drive-in step in order to ensure the ohmic contact. In a PECVD process, an aC:H layer 72 having a thickness of approximately 300 nm was deposited as passivation layer onto the front side of the wafer 112 directly onto the polished silicon surface. During the deposition, the wafer was kept at a constant temperature by means of helium rear-side cooling. The process gas used was methane at a flow rate of 150 sccm. The RF power was able to be varied between 50 W and 1250 W during the radiofrequency plasma deposition.

During the deposition, a DC self-bias was established depending on the working pressure and the RF power chosen, and was able to reach values up to more than −1000 V. Furthermore, the passivation layers were able to be doped by admixture of triethyl borate (TEB).

After deposition, the whole-area contact electrode was applied to the rear side of the wafer and the aC:H layer had applied to it a multilayer metallization that was masked by means of lift-off technology. These structures respectively encompassed the central contact pad 200, which is annularly enclosed by a second electrode 212 at a distance of a few micrometers.

This arrangement made it possible, by comparing the current-voltage characteristic curves measured vertically and laterally, to determine the voltage-dependent resistance of the amorphous-crystalline junction Rs and the specific conductivity σ, or the sheet resistance Rb of the aC:H layer. Furthermore, by means of a frequency-dependent measurement over the vertical structure, it was possible to determine the interface capacitance Cs and from this, in accordance with (7), the state density.

Figure 11:
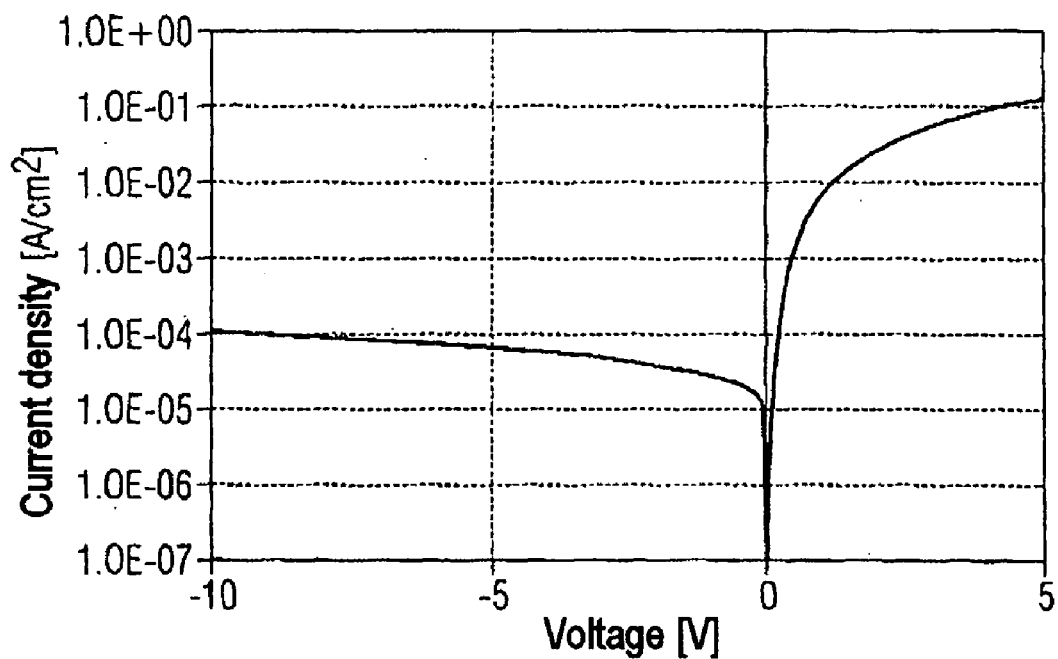
FIG. 11 shows the characteristic curve between current density and voltage at a temperature of 25° C. during measurements on a test structure in accordance with FIG. 10 for a p-doped silicon wafer having a resistivity of 1.5 Ωcm and a doped aC:H layer as passivation layer.

On the basis of the test structure illustrated in FIG. 10, the current density was measured depending on a voltage applied between the terminal electrodes 200, 210, for a p-doped silicon substrate material having a resistivity of 1.5 Ωcm and a doped aC:H layer applied thereto as passivation layer. The result of this measurement, which was carried out at a temperature of 25° C., is plotted in FIG. 11. The specific conductivity σ of the aC:H layer was in this case approximately $1 \cdot 10^{-8}$ (Ωcm)$^{-1}$, given a ratio of the maximum junction resistance Rs,max to sheet resistance Rb of Rs,max/Rb≈10.

When a negative potential is applied to the Si substrate electrode 210 on the rear side of the wafer, a depletion layer forms at the interface between the passivation layer 72 and the substrate 110. In the event of a positive polarity, a forward loading is present, the current being limited as the forward voltage increases through the sheet resistance Rb of the passivation layer in series with the substrate 110 or semiconductor body.

Assuming that the blocking current is supplied by generation at the amorphous-crystalline interface between substrate 110 and passivation layer, the surface state density can be estimated from the blocking current level. On the basis of the Shockley-Read-Hall statistics, it is possible, according to D. J. Fitzgerald, A. S. Grove, Surface Science 9 (1968), 347–369, to calculate the generation current density when the surface is highly depleted in accordance with:

$$j_{gen} = q \cdot \frac{\pi}{2} \cdot \sigma_{capt} \cdot v_{th} \cdot kT \cdot n_i \cdot Ds \qquad (9)$$

In this case, q is the elementary charge, $\sigma_{capt}$ is the capture cross section of the surface states, $v_{th}$ is the thermal velocity, k is Boltzmann's constant, T is the absolute temperature, $n_i$ is the intrinsic concentration and Ds is the interface state density. If the typical values for silicon at 25° C. are employed, then values for Ds of the order of magnitude of $1 \cdot 10^{14}$ cm$^{-2}$ eV$^{-1}$ are obtained from the measured saturation current density. In this case, a value of $\sigma_{capt} = 5 \cdot 10^{-16}$ cm$^2$ was taken as basis for the capture cross section of the surface states, according to D. J. Fitzgerald et al., loc. cit.

The relatively high value for the interface state density Ds under the deposition conditions taken as a basis here is an indication of a high electronic reaction of the passivation layer 72 of the test structure. A further confirmation of this is afforded by the admittance measurement described below.

In order to be able to characterize the amorphous-crystalline interface between the amorphous layer 72 and the substrate 110 in the case of the test structure or the amorphous layer 70 and the semiconductor body 100 of the components by means of admittance measurements, firstly the transfer response of the equivalent circuit illustrated in FIG. 10 is calculated. The following holds true for the series impedance Z of the two parallel elements, comprising junction resistance Rs and interface capacitance Cs, also sheet resistance Rb and sheet capacitance Cb of the passivation layer:

$$Z = \frac{1}{i\omega Cs + \frac{1}{Rs}} + \frac{1}{i\omega Cb + \frac{1}{Rb}} \qquad (10)$$

where $\omega = 2\pi \cdot f$ is the angular frequency and i is the imaginary unit.

After transformation, the following results from this in the admittance plane Y:

$$Y = \frac{1}{Z} = G + i\omega C$$

The real part of the complex admittance represents the total conductance G and the imaginary part represents the total capacitance C in accordance with:

$$G = \frac{Rs + Rb + \omega^2 RsRb \cdot (RsCs^2 + RbCb^2)}{(Rs + Rb)^2 + \omega^2 Rs^2 Rb^2 \cdot (Cs + Cb)^2} \qquad (12)$$

$$C = \frac{Rs^2 Cs + Rb^2 Cb + \omega^2 Rs^2 Rb^2 CsCb \cdot (Cs + Cb)}{(Rs + Rb)^2 + \omega^2 Rs^2 Rb^2 \cdot (Cs + Cb)^2} \qquad (13)$$

An analysis of the transfer response shows that, for high frequencies of an applied voltage in the range of 100 kHz–1 MHz, as are customary for standard C(U) measurements, under the values to be expected here for Cs>>Cb, the dielectric capacitance Cb of the passivation layer 70 determines the total capacitance C, that is to say that the following holds true:

$$C(\omega \to \infty) = Cb = \frac{\varepsilon \cdot \varepsilon_0}{d} \qquad (14)$$

In this case, $\varepsilon_0$ designates the electric constant. The relative permittivity $\varepsilon$ can be determined from such a "high-frequency" measurement given a known layer thickness d. For aC:H as passivation material, a value of $\varepsilon \approx 4$ results for the relative permittivity. It should be pointed out that during C(U) measurements, an AC voltage having a small amplitude, usually in the region of 100 mV, is superposed on an applied DC voltage. During the measurement, this small signal amplitude remains constant and the bias voltage is varied.

Figure 12:
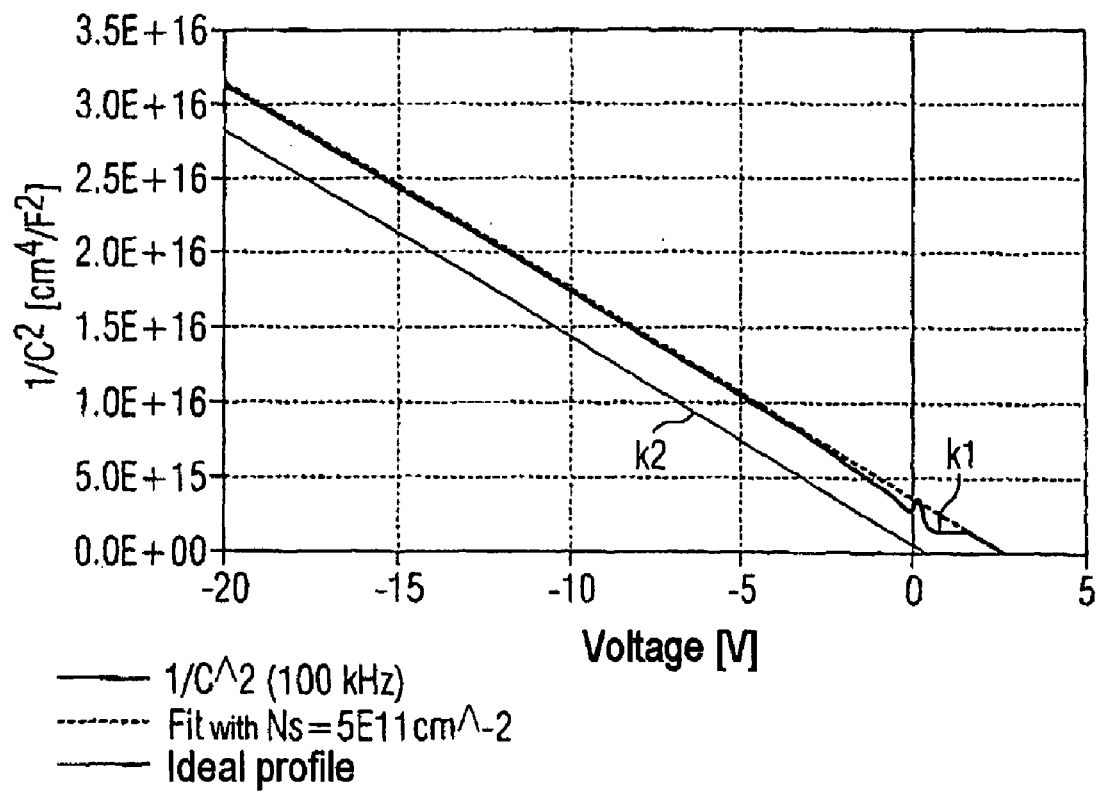
FIG. 12 shows the value—determined on the basis of a radiofrequency capacitance measurement—for the reciprocal of the square of a capacitance formed by the passivation layer ($1/C^2$).

In FIG. 12, in the curve designated by K1, the values for the reciprocal of the square of the capacitance, that is to say $1/C^2$, are plotted against the bias voltage at a test signal frequency of 100 kHz. The passivation layer 72 used for this measurement was the above-explained aC:H layer on a p-Si substrate having a resistivity of 1.5 Ωcm through doping with a doping concentration of $8.7 \cdot 10^{15}$ cm$^{-3}$. The curve designated by K2 shows the (ideal) profile of $1/C^2$, which results given an ideal Schottky contact.

As can be seen, a straight line results for the profile of $1/C^2$ in the case of an amorphous-crystalline junction in an analogous manner to that in the case of a Schottky contact. Ideally, the band bending can be determined from the point of intersection with the abscissa and the substrate doping can be determined from the gradient. If it is assumed that the Fermi level at the surface lies approximately in the band center on account of the high state density, then a value of 0.3–0.4 V is to be expected for the band bending.

As can be seen from FIG. 12, the profile of the measured curve for $1/C^2$ is shifted toward higher values in a parallel manner relative to the ideal curve profile. This parallel shift indicates a counter-charge that shifts the threshold voltage for the formation of the depletion layer. In the example illustrated, a positive charge density—which is constant for relatively high reverse voltages—of approximately $5 \cdot 10^{11}$ q/cm can be calculated from the magnitude of the shift. With this value and with a gradient corresponding to the substrate doping of $8.7 \cdot 10^{15}$ cm$^{-3}$, it is possible to fit the measured curve well for relatively high voltages. Until the effect of the depletion layer capacitance commences, the interface resistance Rs takes up part of the voltage, and a corresponding charge density builds up due to the interface capacitance present until the depletion layer resistance having an increasingly higher value dominates in series in the semiconductor layer. It should be pointed out that said depletion layer resistance is not manifested in the case of a reverse-biased component having a pn junction, since the voltage applied to the pn junction is reduced at the surface almost exclusively by means of the tangential electric field strength in the x direction, while the field strength required for building up the charge density over the interface is perpendicular thereto.

This means that a positive basic charge may already be present at the aC:H-passivated Si interface of the test structure even in the case of a vanishingly small electric field gradient, said basic charge being locally amplified or attenuated by the action of the electric field. The passivation layer thus does not behave neutrally, but rather has an electronic reaction on the electric field.

In order to be able to quantify this electronic reaction, the interface capacitance Cs must be known. For this purpose, it is necessary to measure the admittance, as mentioned, at very low frequencies.

In the course of a test experiment, for carrying out such an admittance measurement, a TEB-doped aC:H layer was applied to a p-doped silicon substrate having a resistivity of 5 mΩcm. The depletion layer effects explained above were suppressed through the use of a highly doped silicon substrate material for this measurement. The deposition conditions were chosen so as to result in a ratio of Rs,max/Rb≈10 as maximum value in the flat band case. Using the test setup explained in FIG. 10, a low-frequency AC voltage having a frequency of 20 Hz was applied to the terminal electrodes 200, 210 at different bias voltages.

Figure 13:
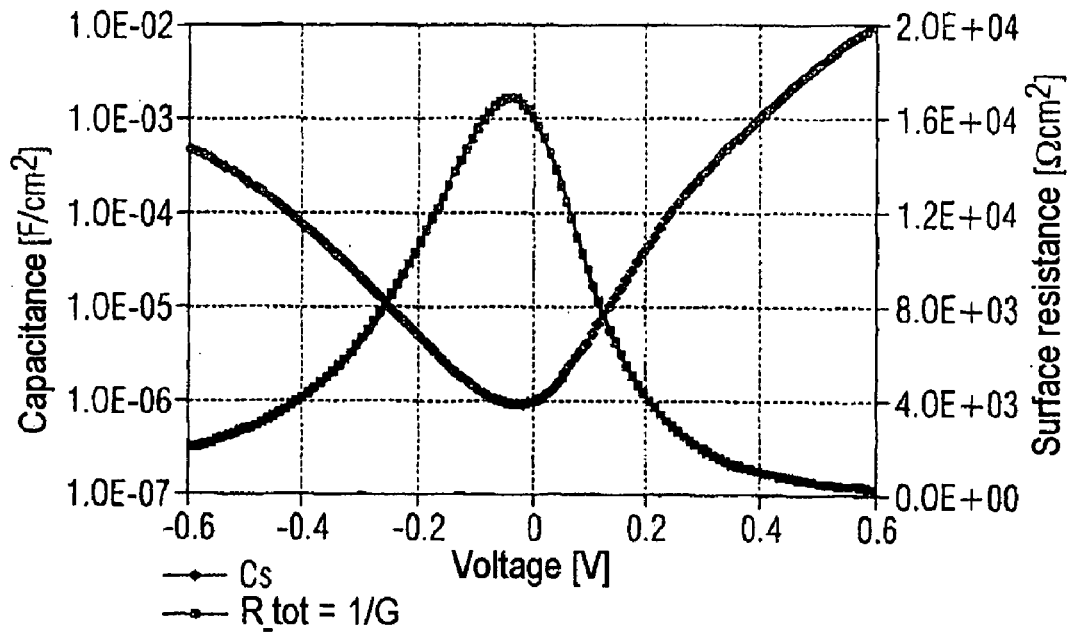
FIG. 13 shows the result of an admittance measurement at 25° C. with a signal frequency of 20 Hz on the basis of the test structure illustrated in FIG. 10 when using a p-doped silicon substrate having a resistivity of 5 mΩcm and a boron-doped aC:H layer as passivation layer.

FIG. 13 illustrates the measurement result for the interface capacitance Cs determined and the total resistance Rtot determined. The measurements were carried out using an LCR meter of the 4284A type from Hewlett Packard.

At a sufficiently low frequency, the measured components of the admittance according to equations (12) and (13) tend toward the following values:

$$G(\overline{\omega} \to 0) = \frac{1}{Rs + Rb} = \frac{1}{Rtot} \quad (15a)$$

$$C(\overline{\omega} \to 0) = \frac{Rs^2 Cs + Rb^2 Cb}{(Rs + Rb)}, \quad (15b)$$

The capacitance values measured on the basis of the sample are distinctly higher than the dielectric capacitance that results according to equation (14), given the chosen layer thickness of 0.3 μm, as Cb≈1.2·10⁻⁸ F/cm². The interface capacitance Cs can be calculated directly on the basis of equation (15b) since all the other variables of this equation are known. The capacitance values thus determined for the interface capacitance Cs directly represent the interface state density Ds according to equation (7). The total resistance exhibits a pronounced voltage dependence caused by the resistance at the interface Rs. As the voltage drop increases at the interface, Rtot tends asymptotically toward the voltage-independent sheet resistance Rb. Voltage values having a magnitude of less than 1 volt already suffice for this.

Figure 14:
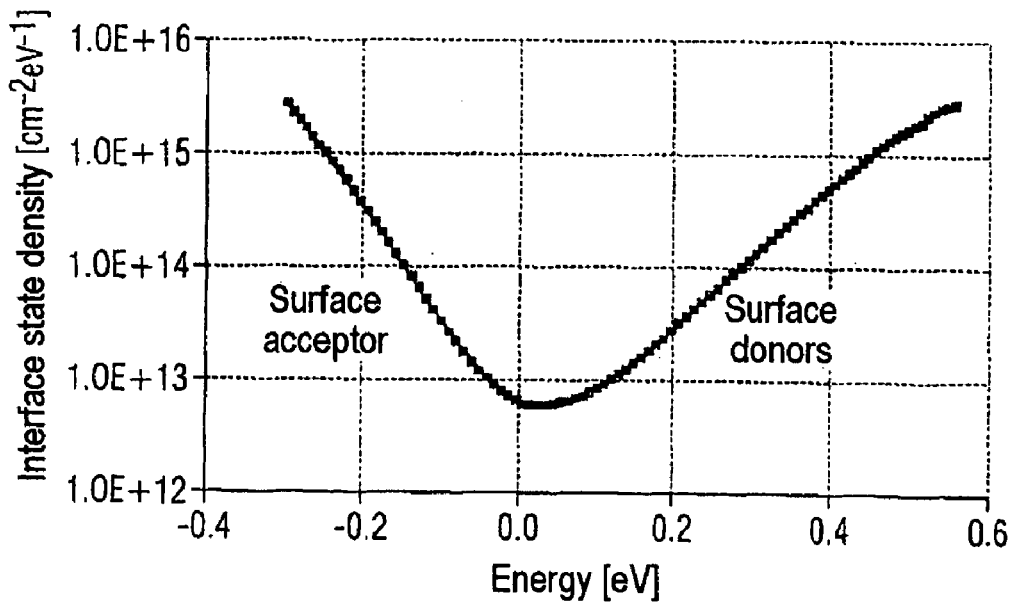
FIG. 14 illustrates the distribution of the surface state density that was determined on the basis of the measurement result of the admittance measurement as illustrated in FIG. 13.

The voltage drop at the interface can be determined from the resistance ratio between sheet resistance, which is calculated from the specific conductivity according to $$Rb = \frac{d}{\sigma} \quad (16)$$

and the voltage-dependent resistance Rs=Rtot−Rb. This directly produces the distribution—illustrated in FIG. 14—of the surface state density for the explained 5 mΩcm p-type silicon substrate with the applied TEB-doped aC:H layer. This distribution confirms the state density values estimated from the saturation level of the blocking current in FIG. 11.

The energy zero point represents the position of the Fermi level for Us=0. The fact that this energy zero point does not lie exactly at the minimum of the distribution, but rather is shifted toward negative values, likewise signals the basic occupation of the interface with a positive charge density. If the Fermi level is shifted from this position by a voltage drop at the interface, a corresponding reoccupation of the surface states occurs. What is important for the effective charge build-up is that the limit resistance Rs assumes the highest possible values precisely in the flat band case since this resistance contribution supplies the driving voltage for reoccupation of the surface states.

By virtue of the passivation layer being doped with boron on account of the TEB addition, the acceptor like band tail is highly pronounced. The extent to which the states can be occupied depends substantially on the interface resistance Rs, however. The following is obtained with equations (6) and (16):

$$U_s(x) = \frac{R_S}{R_B} \cdot d^2 \cdot \frac{\partial E_x}{\partial x} \quad (17)$$

Figure 15:
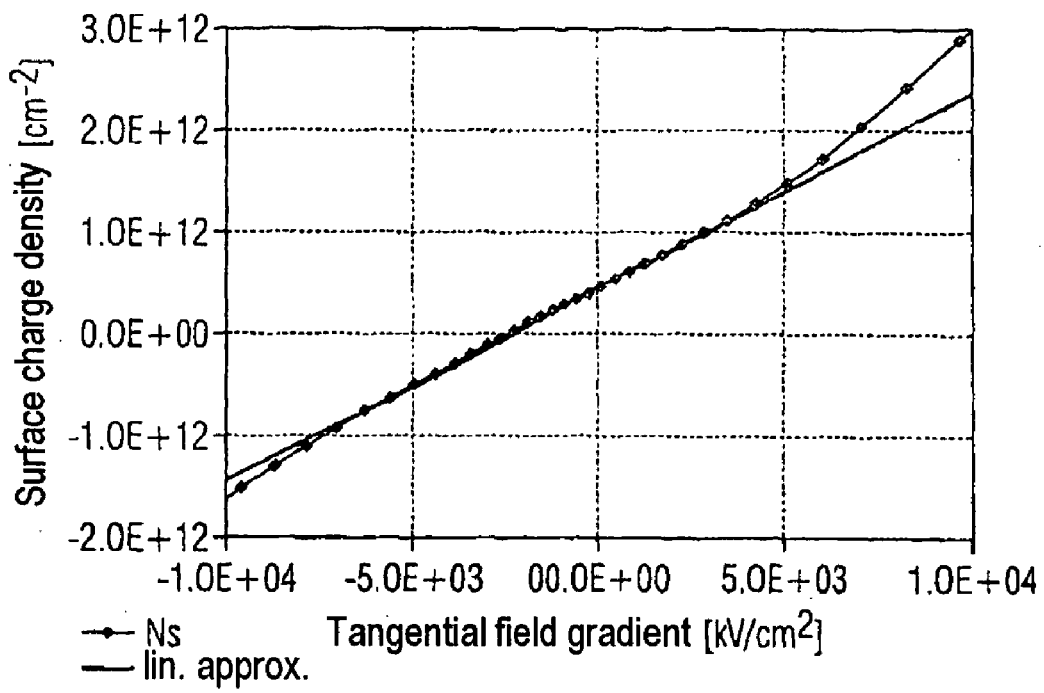
FIG. 15 shows the dependence of the surface charge density established at the interface between the passivation layer and the semiconductor body on a tangential field gradient.

This relationship is used to calculate the charge density established as a function of the tangential field gradient. Together with equations (7) and (8) the sought relationship Qs(δE$_x$/δx) results from the integration of the state density function. The definition $$N_s(x) = Q_s(x)/q \quad (18)$$

hereinafter denotes the density of positive and negative elementary charges at the surface in cm⁻². The relationship Ns(δE$_x$/δx) for the example cited is illustrated in FIG. 15. This takes account of the fact that, in accordance with the shifted high-frequency C(U) curve, a positive charge density of 5·10¹¹ cm⁻² is still present even for a vanishing field gradient. The same relationship also results in the case of an n-type substrate.

In the case of the example explained, the function N$_S$(δE$_x$/δx) is thus independent of the substrate and determined exclusively by the properties of the interface and also of the aC:H bulk material which stem from the coating process.

In this case, the sum of the field gradient in the calculation of the function N$_S$(δE$_x$/δx) is defined by the following convention: when considering the structures shown in FIGS. 3 to 7, in the event of a reverse voltage being applied to the component, the p⁺-type region, or the anode, 20 is at negative potential and the channel stopper or the n⁺-type region 14 is at ground. The potential rises monotonically from the anode 20 to the channel stopper 40. This results in a positive or negative gradient depending on the local curvature of the potential profile downward or upward.

A high surface state density at the amorphous-crystalline interface between the semiconductor body 100 and the passivation layer 70 by virtue of the setting of suitable deposition conditions for the passivation layer is evidently characterized (even in the case of boron doping) by the dominance of the donorlike states. This leads, as described above, even at Us=0, to a basic occupation of the interface with positive charges that has the consequence that the N$_S$(δE$_x$/δx) distribution becomes asymmetrical. For the aC:H passivation of an Si surface that is characterized by a high electronic reaction, this means that edge structures which require a negative charge density for attenuating the field strength are more difficult to optimize. In this case, it is always necessary firstly to counter-compensate for the prevailing positive charge density. This inevitably results in higher (negative) field gradients until the required charge densities of the order of magnitude of the breakdown charge ($>10^{12}$ cm$^{-2}$) are reached and this in turn has the consequence that the field distribution has a steeper profile and field strength spikes can be reduced less effectively.

The function $N_s(\delta E_x/\delta x)$ can be described to an approximation by a linear function, in accordance with:

$$N_s = r \cdot \frac{\delta E_x}{\delta x} + N_{const} \quad (19)$$

where r is the reaction factor already explained, having a value of approximately $2 \cdot 10^8$ (kV)$^{-1}$ in the case of the example illustrated in FIG. 15.

The physical significant of r emerges from the following consideration:

If the functions Ds(E) and Rs(Us) are developed at the point at which both functions assume their extremum in a Taylor series up to the 1st order, then as a result of the omission of the differential terms for the energy range directly in the vicinity of the Fermi level, according to equations (7), (8) and (18), the following results to an approximation:

$$Ns - Nconst \approx q \cdot Ds, min \cdot Us \quad (20)$$

and after insertion of (6):

$$Ns - Nconst \approx q \cdot Ds, min \cdot Rs, max \cdot \sigma \cdot d \cdot \frac{\delta E_x}{\delta x} \quad (21)$$

The reaction factor r is thus defined by the following relationship:

$$r = q \cdot Ds, min \cdot Rs, max \cdot \sigma \cdot d \quad (22)$$

In this case, Ds,min denotes the minimum of the state density distribution Ds, which can be determined in accordance with (7) from the minimum Cs,min of the interface capacitance, and Rs,max denotes the maximum of the voltage-dependent junction resistance Rs.

The value of r contains the properties of the ac:H silicon interface, namely state density and resistance at the interface in the flat band case (i.e. the Fermi level lies at the charge centroid) and the layer itself, namely specific conductivity and layer thickness. Its magnitude is thus dependent in particular on the deposition conditions chosen.

In the case of an aC:H-passivated amorphous-crystalline interface between the passivation layer 70 and the semiconductor body 100, under deposition conditions of the passivation layer that lead to a high electronic reaction at the interface, the charge states established significantly concomitantly influence the field profile at the semiconductor surface.

Taking account of equations (7) and (16), the relationship for the reaction factor already mentioned in the introduction follows from (22):

$$r = \frac{1}{q} \cdot \frac{Rs, max}{Rb} \cdot Cs, min \cdot d^2 = q \cdot \frac{Rs, max}{Rb} \cdot Ds, min \cdot d^2 \quad (23)$$

In order to obtain a sufficiently high reaction of the passivation layer 70 on the field profile of the electric field in the semiconductor body 100, Rs,max/Rb>1 preferably holds true.

The influence of the electroactive passivation layer 70 on the field profile in the semiconductor body rises as the reaction factor increases. The deposition conditions for the passivation layer are preferably chosen such that $r \geq 1 \cdot 10^5$ kV$^{-1}$ holds true for said reaction factor.

The effects of said reaction factor on the blocking behavior of the components are explained below.

A simple well structure (not specifically illustrated) comprising a p$^+$n well in an n-type semiconductor layer, without a RESURF structure, shall be considered first of all. The reverse voltage amounts to approximately 300 V owing to the absence of surface charges. The breakdown is effected at the p$^+$-type well on account of the p$^+$n junction running in curved fashion, as has already been explained in the introduction. The maximum blocking capability in the bulk of the component, by contrast, would be approximately 4800 V.

A RESURF structure according to FIG. 4 which was examined on the basis of experiments and simulations will now be taken as a basis hereinafter.

An example is considered in which the vertical diffusion depth of the p$^+$-type region 20 with boron doping is 6 μm and the edge concentration is $5 \cdot 10^{18}$ cm$^{-3}$. Given a boron implantation dose of, for example, $1 \times 10^{12}$ cm$^{-2}$ for the π region, a junction depth of approximately 5.2 μm is established given the same thermal budget used. Neutron-doped zone-refined silicon (LC silicon) having a resistivity of 350 Ωcm and a thickness of 375 μm is used as the basic material. For the channel stopper 40 and for the cathode 14, phosphorus is implanted with a dose of $1 \cdot 10^{15}$ cm$^{-2}$ into the semiconductor layer 12. The lateral distance between p$^+$-type region 20 and channel stopper 40 is 640 μm.

The production of the π zone 30 means that negative charges are introduced at the component surface 101, which attenuate the strong concentration of the field lines in the region of curvature, as a result of which the reverse voltage rises. If the doping dose of the π zone 30 is chosen to have a magnitude such that it reaches the order of magnitude of the breakdown charge, then the field is entirely dispelled from the p$^+$-type well 20 in the direction of the channel stopper 30. The location of the surface breakdown is displaced and the reverse voltage decreases again. In the case of moderate doping doses for the π zone 30, a well-type field profile results and the blocking capability reaches its maximum value.

Figure 16:
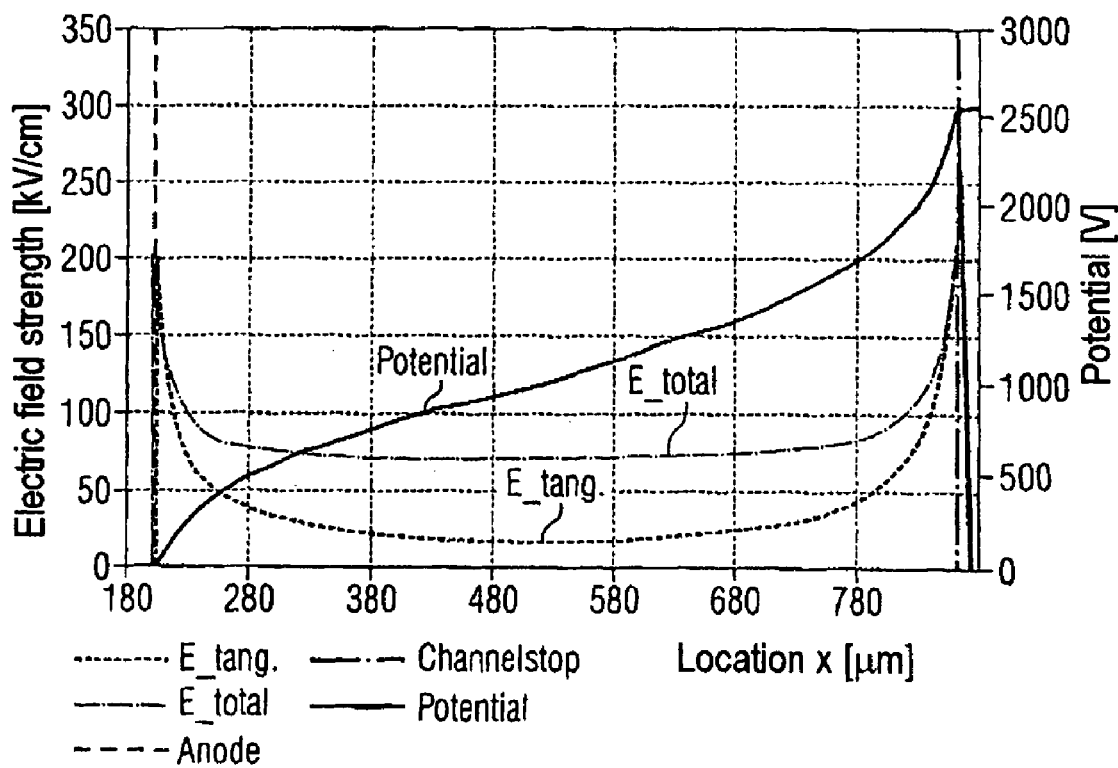
FIG. 16 illustrates the potential, the tangential component and the magnitude of the field strength at the surface of a semiconductor body having a RESURF structure which is implanted with a π dose of $1 \cdot 10^{12}$ cm$^{-2}$ and at the surface of which a constant positive charge density of $5 \cdot 10^{11}$ cm$^{-2}$ is present.

If an aC:H passivation layer is then applied at the interface and initially a constant, positive charge density of $5 \cdot 10^{11}$ cm$^{-2}$ with a negligibly small electronic reaction r is assumed (cf. FIG. 12), then the π dose required for achieving the maximum blocking capability of 2600 V is approximately $1 \cdot 10^{12}$ cm$^{-2}$ according to the simulation. The associated profile of the potential, the tangential field strength and the field strength magnitude along the semiconductor surface for this case is illustrated in FIG. 16.

Figure 17:
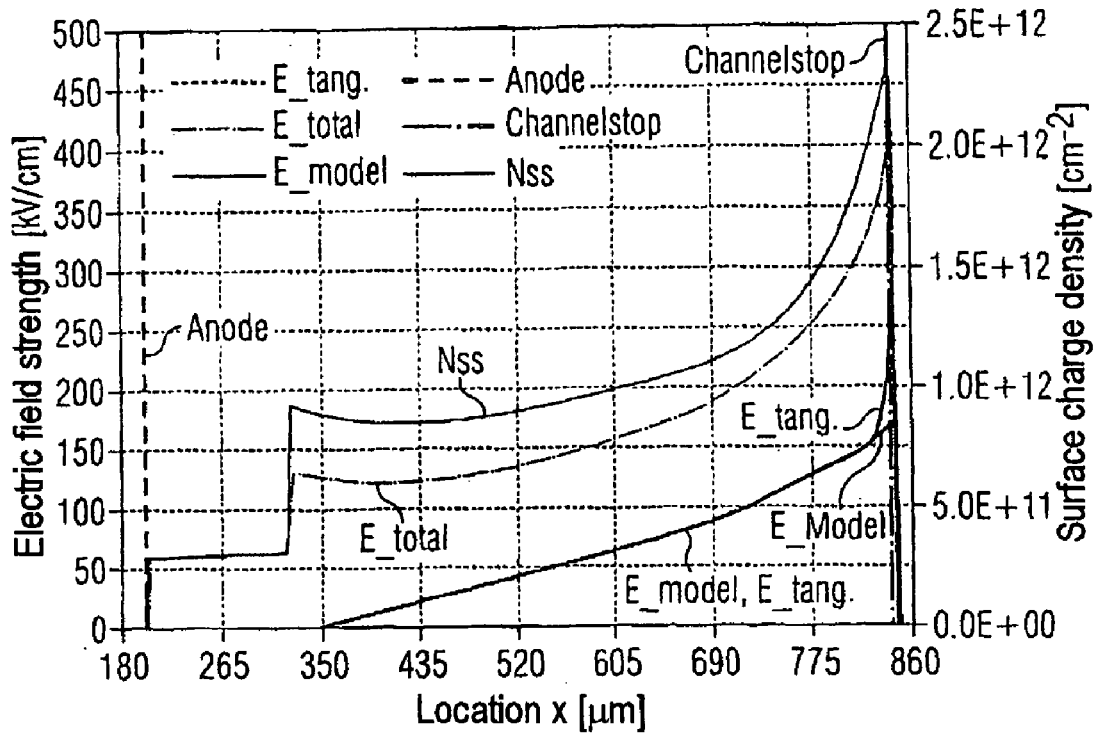
FIG. 17 shows the field distribution in accordance with FIG. 16 for a component in which an aC:H layer for which a reaction factor $r = 2 \cdot 10^8$ kV$^{-1}$ was set is applied to the surface of the component.

The case according to the invention of a non-negligible electronic reaction r shall now be considered. The simulation is based on said π dose of $2 \cdot 10^{12}$ cm$^{-2}$ and a constant positive charge density of $N_{const}=5 \cdot 10^{11}$ cm$^{-2}$ and the reaction factor of $r=2\cdot10^8$ $(kV)^{-1}$ determined in FIG. 15. The charge density distribution established and the field profile resulting therefrom are calculated in a self-consistent manner using equation (19). The result is illustrated in FIG. 17. The reverse voltage that can be achieved amounts to approximately 3500 V under these boundary conditions. In this case, a field gradient that is positive throughout is established, which reaches its maximum value of approximately $9\cdot10^3$ $kV/cm^2$ at the channel stopper 40. A charge density of $2.3\cdot10^{12}$ $cm^{-2}$ corresponds to this at this point. The electronic reaction of the interface states on the blocking behavior results in a huge change in the field distribution. Comparison with FIG. 16 shows that the tangential electric field has been significantly alleviated at the channel stopper, which is manifested both in the field distribution and in the higher blocking capability. The field spike at the anode has completely disappeared due to the higher $\pi$ doping.

Method steps for producing a passivation layer according to the invention with a non-negligible electronic reaction are explained below on the basis of a method carried out in the experiment.

During the experiment, the aC:H layer with a non-negligible reaction r was deposited in a PECVD installation in which the required RF power was coupled capacitively into the plasma by means of a radio frequency generator at 13.56 MHz. The substrate electrode in the deposition chamber was designed for receiving a 6" wafer. By means of this it was additionally possible to ensure a maximum process temperature of 100° C. through active helium rear-side cooling of the wafer.

The working pressure of 50 mtorr was aided by a methane flow of 150 sccm. A doping gas comprising triethyl borate (TEB) was simultaneously admixed with the gas flow. Since triethyl borate is liquid at room temperature, the TEB was injected into helium as carrier gas by means of an LFC (liquid flow controller). The mass flow rate was 20 mg/min TEB and 100 sccm helium in this case. After stabilization of the gas streams and of the working pressure at 50 mtorr, the plasma was ignited at an RF power of 990 watts. A DC bias of −850 volts was established as the plasma potential under these conditions. As a result of this plasma potential, the ionized carbon compounds take up the corresponding energy upon impinging on the substrate. In this case, both the DC bias value and the doping—originating from the TEB addition—of the layer with oxygen and boron essentially determine the properties of the amorphous-crystalline interface and of the aC:H bulk material. In addition to boron and oxygen as doping atoms, it is also possible here to use other elements such as, by way of example, silicon, nitrogen, phosphorus or else metals.

The doping of the aC:H layer may also be dispensed with, if appropriate.

What is crucial is that working pressure and RF power, and also a doping, if appropriate, are coordinated with one another in such a way as to result in the required electronic reaction factor in the case of the component to be passivated. In the case of an undoped aC:H layer, in order to obtain such reaction factors and DC bias values, very high RF powers are required which accompany DC bias values of more than −1000 V. The DC bias values are increased in this way by adapting the working pressure and the RF power.

A further important precondition for setting a sufficiently high interface resistance in combination with a high interface capacitance, which is necessary for obtaining high interface state densities, is the conditioning of the semiconductor surface itself. The latter must be configured in such a way that a continuous layer with covalently bonded silicon carbide (SiC) can form directly at the amorphous-crystalline interface during the deposition. For this purpose, the surface must be free of adsorbates, precipitates or insulating layers such as, for example, an oxide layer. Such conditioning of the semiconductor surface can be achieved by overetching the surface or by growing a thermal oxide and removing the latter directly prior to the deposition of the aC:H layer.

Figure 18:
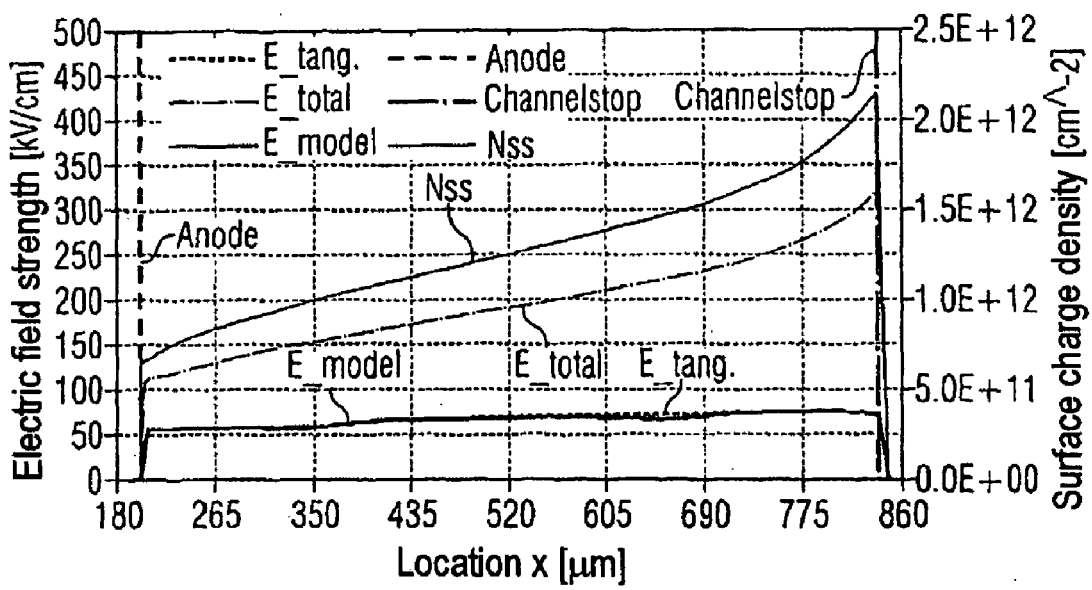
FIG. 18 shows a field distribution in accordance with FIG. 16, a passivation layer with a reaction factor of $r = 4 \cdot 10^9$ kV$^{-1}$ being applied to the surface of the component.

If the conditions during the aC:H deposition are chosen in such a way that an even higher degree of reaction $r>>2\cdot10^8$ $(kV)^{-1}$ results, the field gradient is flattened further and the blocking capability increases further. A simulation with $r=4\cdot10^9$ $(kV)^{-1}$ results in a reverse voltage of 4200 V. In this case, the space charge zone finally extends over the entire $\pi$ region and the breakdown location is displaced again back to the anode into the curved $p^+$-type region. The maximum field gradient amounts to only approximately 500 $kV/cm^2$ in this case. The result is plotted in FIG. 18.

Figure 19:
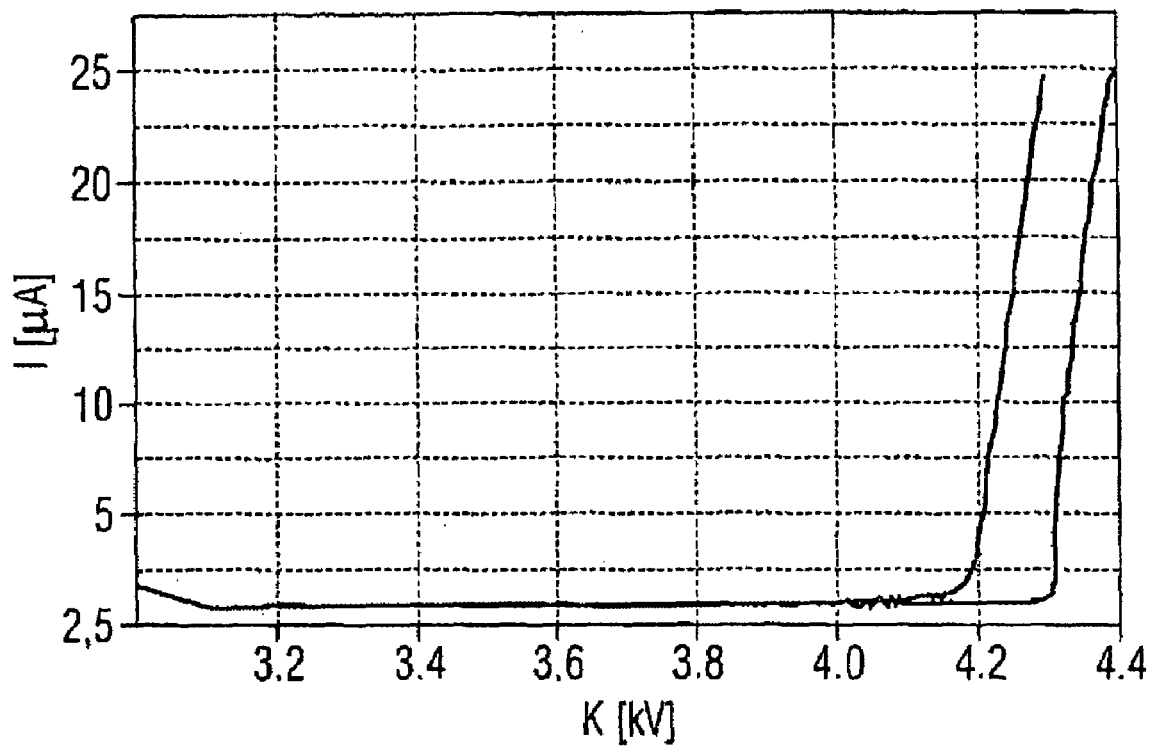
FIG. 19 illustrates the dielectric strength of a semiconductor component according to the invention for different edge widths.

The associated experimental result is illustrated in FIG. 19. It shows the blocking characteristic curves of two systems with corresponding aC:H passivation. The RESURF dose was chosen as in the simulation with $2\cdot10^{12}$ $cm^{-2}$ and the width of the $\pi$ zone is 650 μm in one case and 850 μm in the other case.

The interface state density Ds required for realizing a correspondingly high reaction factor is determined below.

In deriving equation (22), sufficiently small voltage values were assumed for the validity of the Taylor development. If said values reach a magnitude of 0.5–0.6 volt, then the voltage drop at the interface reaches its saturation value as a result of the decay of Rs (see FIG. 13). A further increase in the voltage is then dropped exclusively across the series resistance Rb and thus likewise leads to the saturation of the charge density. Thus, in accordance with FIG. 13, the magnitude of the convergence radius for the voltage range in which the approximation made is valid corresponds approximately to half the band gap of the semiconductor, ±0.56 V in the case silicon. In order to ensure a high electronic reaction and as a precondition for the validity of the approximation effected (equation 20), the relationship explained in the introduction holds true, namely that the minimum surface state density at least corresponds to the quotient of the breakdown charge $N_{S,Bd}$ (approximately $1\cdot10$ $cm^{12}$ $cm^{-2}$ in the case of Si) and the band gap $E_g$ (1.12 eV in the case of Si) of the semiconductor material:

$$D_{S,\min} \geq \frac{N_{S,Bd}}{E_q} \quad (24)$$

A further boundary condition that is advantageously taken into account is the proportion of blocking current that flows away via the interface and via the aC:H layer. This proportion should not lie appreciably above the bulk blocking current in the case of the components realized in this way. The latter is of the order of magnitude of 100 nA to approximately 10 μA in the case of a rapidly switching power component having a chip area of approximately 1 $cm^2$ at room temperature. It is expedient, therefore, to demand a blocking current which flows via the edge and does not become greater than 1 μA per cm edge length. The integration of the current density flowing away into the aC:H along the space charge zone leads according to equation (4) to:

$$I_l(w) = \sigma \cdot d \cdot E_x(w) \quad (25)$$

In this case, $I_f(w)$ is the blocking current flowing away via the pn junction at the channel stopper (per cm edge length) and $E_x(w)$ is the tangential electric field strength prevailing there. Since the aim is to obtain no parasitic blocking current portions through avalanche generation, $E_x(w)$ must remain below the critical value until the required reverse voltage is reached or until the breakdown in the component bulk is reached. Said critical value is approximately 200 kV/cm in silicon.

It is expedient, moreover, from technological standpoints to deposit the aC:H layer with a thickness of the order of magnitude of 0.1 μm to 1 μm. For aC:H as passivation material, this results in an upper limit for the specific conductivity of $\approx 1 \cdot 10^{-6}$ $(\Omega cm)^{-1}$. On the other hand, σ should have a minimum value in order to ensure a finite reaction factor according to equation (22).

The specific conductivity may be set by means of a corresponding variation of the deposition parameters which leads to a changed ratio of $sp^3/sp^2$ portions in the aC:H layer, or by means of an adequate doping.

The lower limit for the specific conductivity results from the required reaction factor in accordance with equation (22). In the case of the situation illustrated in FIG. 17, an electronic reaction factor of $r=2\cdot 10^8$ $(kV)^{-1}$ has already had a significant influence on the field distribution and on the blocking capability. In the case of less critical structures having a lower resistivity of the base material and having a lower reverse voltage, by contrast, a smaller reaction factor may already lead to the desired result. Therefore, a value of $r \geq 1 \cdot 10^5$ $(kV)^{-1}$ is advantageously demanded here for all the cited edge structures and semiconductor materials such as, by way of example, Si, SiC, GaAs, etc.

If all of these boundary conditions are complied with, then it is possible to satisfy both the demand for a sufficiently low blocking current and the demand for a sufficiently high attenuation of the peak field strength at the surface of the component.

When using n-type silicon as base material, a sufficiently highly doped π zone is preferably produced in order to achieve a good acceptance of the edge termination with respect to positive charges. When using a p-doped base material and indiffusion of an $n^+$-doped well region, that is to say in the case of a structure which corresponds to that illustrated in FIG. 4 but in which the semiconductor regions are doped complementarily, a corresponding acceptance exists from the outset, with the result that a π zone can be dispensed with in this case.

The invention claimed is:

1. A semiconductor component comprising:
a semiconductor body;
at least one pn junction present in the semiconductor body; and
an amorphous passivation layer arranged at least in sections on a surface of the semiconductor body so as to define an interface between the passivation layer and the semiconductor body, the interface having an interface state density that is greater than a breakdown charge divided by a band gap of a semiconductor material used for the semiconductor body; and
wherein for a reaction factor:

$r = q*(R_{s,max}/R_b)*D_{s,min}*d^2$ the following holds true:

$(r) \geq 10^5$ $kV^{-1}$ where q is the elementary charge, $R_{s,max}$ is the maximum value of a junction resistance $R_s$ between the passivation layer and the semiconductor body, $R_b$ is a sheet resistance of the passivation layer, and d is a thickness of the passivation layer, and $D_{s,min}$ is the minimum interface state density.

2. The semiconductor component as claimed in claim 1, in which $(R_{s,max}/R_b) \geq 1$.

3. The semiconductor component as claimed in claim 1, in which $(R_{s,max}/R_b) \geq 10$.

4. The semiconductor component as claimed in claim 1, in which the semiconductor body further comprises a semiconductor layer of a first conduction type and a first semiconductor zone that is doped complementarily with respect to the semiconductor layer, the first semiconductor zone disposed proximate to a front side of the semiconductor body.

5. The semiconductor component as claimed in claim 4, in which the first semiconductor zone ends at a distance from an edge area of the semiconductor body in the lateral direction, and in which at least a portion of the passivation layer extends laterally substantially to the edge area of the semiconductor body.

6. The semiconductor component as claimed in claim 5, wherein the semiconductor layer further comprises a channel stopper zone located in a section of the semiconductor layer between the edge area and the front side of the semiconductor body, the channel stopper zone being more heavily doped than the semiconductor layer.

7. The semiconductor component as claimed in claim 4, in which the first semiconductor zone extends to the edge area of the semiconductor body, the passivation layer being applied to the edge area of the semiconductor body.

8. The semiconductor component as claimed in claim 7, wherein the edge area is beveled relative to the front side of the semiconductor body.

9. The semiconductor component as claimed in claim 4, wherein the semiconductor body further comprises a second semiconductor zone doped complementarily with respect to the semiconductor layer, the second semiconductor zone adjoining the passivation layer.

10. The semiconductor component as claimed in claim 9, wherein the second semiconductor zone is located in the semiconductor layer between the first semiconductor zone and the edge area of the semiconductor body.

11. The semiconductor component as claimed in claim 6, wherein the semiconductor body further comprises a second semiconductor zone doped complementarily with respect to the semiconductor layer, the second semiconductor zone disposed in the semiconductor layer between the first semiconductor zone and the channel stopper zone, the second semiconductor zone adjoining the passivation layer.

12. The semiconductor component as claimed in claim 1, wherein the amorphous passivation layer includes one of the group consisting of: amorphous hydrogen-containing carbon, amorphous silicon, or amorphous silicon carbide.

13. The semiconductor component as claimed in claim 1, wherein the amorphous passivation layer comprises a plasma enhanced chemical vapor deposited passivation layer.

* * * * *